United States Patent
Yuasa

(10) Patent No.: US 8,569,774 B2
(45) Date of Patent: Oct. 29, 2013

(54) ORGANIC EL DISPLAY PANEL AND METHOD OF MANUFACTURING THE SAME

(75) Inventor: Hiroshi Yuasa, Kyoto (JP)

(73) Assignee: Panasonic Corporation, Osaka (JP)

( * ) Notice: Subject to any disclaimer, the term of this patent is extended or adjusted under 35 U.S.C. 154(b) by 7 days.

(21) Appl. No.: 13/176,353

(22) Filed: Jul. 5, 2011

(65) Prior Publication Data

US 2012/0025224 A1 Feb. 2, 2012

Related U.S. Application Data

(63) Continuation of application No. PCT/JP2010/004760, filed on Jul. 27, 2010.

(51) Int. Cl.
*H01L 33/36* (2010.01)
*H01L 33/00* (2010.01)

(52) U.S. Cl.
USPC ............ 257/89; 257/40; 257/59; 257/72; 257/79; 313/503

(58) Field of Classification Search
None
See application file for complete search history.

(56) References Cited

U.S. PATENT DOCUMENTS

| | | | |
|---|---|---|---|
| 5,443,922 | A | 8/1995 | Nishizaki et al. |
| 7,888,867 | B2 | 2/2011 | Yoshida et al. |
| 2007/0063639 | A1 | 3/2007 | Hamano et al. |
| 2007/0200983 | A9 * | 8/2007 | Inoue et al. .............. 349/113 |

(Continued)

FOREIGN PATENT DOCUMENTS

| JP | 5-163488 | 6/1993 |
|---|---|---|
| JP | 2003-059660 | 2/2003 |
| JP | 2006-201453 | 8/2006 |

(Continued)

OTHER PUBLICATIONS

Translation, computerized, from the Japan Patent Office (JPO), of Toyama (JP-2008039843-A), Feb. 2008, translation obtained on Dec. 2, 2012.*
U.S. Appl. No. 13/100,520 to Takayuki Takeuchi, filed May 4, 2011.

*Primary Examiner* — Johannes P Mondt
(74) *Attorney, Agent, or Firm* — Greenblum & Bernstein, P.L.C.

(57) ABSTRACT

An organic electroluminescence (EL) display panel and method of manufacturing an organic EL display panel. The display panel includes a substrate on which a thin-film transistor layer is formed, with an interlayer insulating film formed above the thin-film transistor layer. A plurality of strip-shaped barrier ribs are arranged in parallel on the interlayer insulating film. Each electrode of a plurality of first electrode groups has first electrodes arranged in a line and arranged between two adjacent barrier ribs of the plurality of strip-shaped barrier ribs, with each of the first electrodes including a transparent conductive film and a reflective metal film formed of a metal material. A plurality of light-emitting layers are each formed to cover a different electrode of the plurality of first electrode groups, while a second electrode is formed above the plurality of light-emitting layers. Each electrode of the plurality of first electrode groups is formed such that an end portion of the first electrode in a parallel direction with respect to the barrier ribs includes a single-film portion in which the transparent conductive film is not formed, and a portion of the first electrode other than the single-film portion includes a two-film portion in which the transparent conductive film is layered on the reflective metal film. A metal oxide film is formed on an entire surface of the single-film portion of each first electrode by partially oxidizing the metal material.

10 Claims, 11 Drawing Sheets

(56) References Cited

U.S. PATENT DOCUMENTS

| | | |
|---|---|---|
| 2010/0012192 A1* | 1/2010 | Dourdeville et al. ............. 137/1 |
| 2010/0072884 A1 | 3/2010 | Tchakarov et al. |
| 2010/0225227 A1 | 9/2010 | Tchakarov et al. |
| 2011/0180821 A1 | 7/2011 | Matsushima |
| 2011/0198623 A1 | 8/2011 | Matsushima |
| 2011/0198624 A1 | 8/2011 | Matsushima |

FOREIGN PATENT DOCUMENTS

| | | |
|---|---|---|
| JP | 2007-026754 | 2/2007 |
| JP | 2007-059383 | 3/2007 |
| JP | 2007-095428 | 4/2007 |
| JP | 2007-273487 | 10/2007 |
| JP | 2008039843 A * | 2/2008 |
| JP | 2008/029060 | 3/2008 |
| JP | 2010-503166 | 1/2010 |

* cited by examiner (a-3)

(b-3)

(c-3)

(d-3)

(e-3)

(f-3)

(a-3)

(b-3)

(c-3)

(d-3)

(e-3)

ORGANIC EL DISPLAY PANEL AND METHOD OF MANUFACTURING THE SAME

CROSS REFERENCE TO RELATED APPLICATION

This is a continuation application of PCT Application No. PCT/JP2010/004760 filed Jul. 27, 2010, designating the United States of America, the disclosure of which, including the specification, drawings and claims, is incorporated herein by reference in its entirety.

BACKGROUND OF THE INVENTION

1. Field of the Invention

The present invention relates to an organic EL display panel using an organic electroluminescence element (hereinafter referred to as "organic EL element") and a method of manufacturing the same, and relates in particular to a technique of improving a structure around an anode.

2. Description of the Related Art

The organic EL element is a current-drive type light-emitting element, and has a basic structure in which a light-emitting layer (including an organic light-emitting material) is positioned between an anode and a cathode. When an organic EL display panel in which organic EL elements are used is driven, voltage is applied between the anode and the cathode. A hole is injected from the anode and an electron is injected from the cathode. In this way, the hole and the electron are recombined in the light-emitting layer so as to cause an electroluminescence phenomenon. The organic light-emitting element takes advantage of this electroluminescence phenomenon. The organic EL element itself emits light and has an excellent visibility. Also, the organic EL element is a solid state component and has an excellent impact-resistance.

According to one of a method of forming a coated organic EL element, ink containing an appropriate amount of macromolecular material and an appropriate amount of low molecules having an excellent thin-film forming property is prepared and is applied on a substrate in an inkjet method or the like so as to form a light-emitting layer and a charge injection layer. There are organic EL display panels in each of which a plurality of coated organic EL elements are disposed in a matrix on the substrate having a TFT wiring part. In recent years, such organic EL display panels have been put to practical use as various types of displays and image display devices, for example.

On the substrate, the organic EL elements are partitioned by banks (barrier ribs) having a predetermined shape. In one of representative line bank structures, a plurality of line banks that extend in a column direction are parallel-arranged in a row direction. Light-emitting elements having the same color are arranged at a predetermined interval between adjacent banks. Light-emitting elements each having one of R, G and B colors are arranged in the row direction so as to perform a color display when a panel as whole is viewed.

FIG. 10 shows some of processes of manufacturing a conventional organic EL display panel. As shown in (e-3) of FIG. 10, an anode (lower electrode) 6X is disposed, in each element forming area, along a longitudinal direction of the bank 10 (an X direction). A gap 11 exists between adjacent element forming areas. The lower electrode 6 is an elongated electrode composed of a reflective metal film 60 and a transparent conductive film 61 layered thereon. The reflective metal film 60 is electrically connected to a power supply electrode 3 of the TFT wiring part through an opening (contact hole 8). Here, the contact hole 8 penetrates through a planarizing film 4. The contact hole 8 is usually formed in a vicinity of an end portion of the lower electrode 6 in the X direction in a non-luminescent area (pixel definition area) of the organic EL element instead of a light-emitting area of the organic EL element. As shown in FIG. 7, an (organic) light-emitting layer 7, an upper electrode 9 and a sealing layer (not depicted) are formed in this order on the lower electrode 6.

In each of the organic EL elements formed on the substrate, a thickness of the light-emitting layer 7 tends to be smaller around edge portions of the reflective metal film 60 in a vicinity of the gap 11 and around the contact hole 8 (especially around an edge of the opening), as shown in FIG. 7. Therefore, a short possibly occurs due to the light-emitting layer 7 being cut and an anomalous light emission possibly occurs due to electrical field concentration in a portion of the light-emitting layer 7 where the thickness is small.

Also, it is necessary that the organic EL elements that are adjacent to one another in the row direction (in the X direction) are defined and separated from one another so as to achieve an appropriate image display performance, in the organic EL display panel having the line bank structure. Therefore, the pixel definition layer 66 is provided between the transparent conductive film 61 and the light-emitting layer 7, as shown in FIG. 8 and (e-3) of FIG. 10. Here, the pixel definition layer 66 is formed using an insulating material such as SiON, and is formed to extend in a direction perpendicular to the longitudinal direction of the bank 10 (the X direction). In an area in which the pixel definition layer 66 is provided, it is possible to prevent current from flowing from the lower electrode 6 and the upper electrode 9 to the light-emitting layer 7 when the organic EL display panel is driven. Certain effects can be expected for preventing the short and uneven brightness due to the abnormal electrical field.

3. Patent Literatures

[Patent Literature 1] Japanese Patent Application Publication No. 2007-26754

[Patent Literature 2] Japanese Patent Application Publication No. 2007-59383

SUMMARY OF THE INVENTION

However, the organic EL display panel having the conventional line bank structure has some problems.

Firstly, a separate process is necessary for forming a pixel definition layer (spattering process in a case where the pixel definition layer is formed using SiON) in manufacturing the organic EL display panel. In addition to the fact that a dedicated device is necessary for this process, manufacturing of the organic EL display panel is possibly complicated, which might lead to an increase in production cost.

Secondary, it is problematic that it is difficult to completely prevent the short between the lower and upper electrodes even if the pixel definition layer is provided. In general, the pixel definition layer is composed of a SiON film formed using a spattering method or a CVD method. However, these methods are not enough to cover a gap formed due to the light-emitting layer being cut. Therefore, when one end portion of the transparent conductive film 61 on the reflective metal film 60 protrudes from the lower electrode 6X so as to be eave-shaped, the gap 11 between the adjacent organic EL elements in the X direction is not fully covered. In some cases, the pixel definition layer is cut. The short possibly occurs between the reflective metal film 60 or the transparent conductive film 61 and the cathode 9 due to current flowing to a gap formed due to the pixel definition layer being cut.

The present invention has, in view of the above, a first objective to provide an organic EL display panel and a method of manufacturing the same. Here, the organic EL display panel can be produced at a comparatively low cost; prevents the short and anomalous light emission without the pixel definition layer; and is expected to appropriately separate the pixels. The present invention has a second objective to provide an organic EL display panel and a method of manufacturing the same. Here, the organic EL display panel is expected to have an excellent image display performance by forming the light-emitting layer having more even thickness compared to the conventional organic EL display panel.

In order to solve the above-stated problems, one aspect of the present invention is an organic EL display panel comprising: a substrate; a thin-film transistor layer formed on the substrate; an interlayer insulating film formed above the thin-film transistor layer; a plurality of strip-shaped barrier ribs that are arranged in parallel on the interlayer insulating film; a plurality of first electrode groups, each of which consists of first electrodes that are arranged in a line and is arranged between two adjacent ones of the barrier ribs, each of the first electrodes including a transparent conductive film and a reflective metal film that is formed of a metal material; a plurality of light-emitting layers each formed to cover a different one of the first electrode groups; and a second electrode formed above the light-emitting layers, wherein each of the first electrodes is formed such that: at least one of end portions of the first electrode in a parallel direction with respect to the barrier ribs is a single-film portion in which the transparent conductive film is not formed; and a portion of the first electrode other than the at least one single-film portion is a two-film portion in which the transparent conductive film is layered on the reflective metal film, and a metal oxide film is formed, at least partially on an entire surface of the at least one single-film portion of each of the first electrodes, by partially oxidizing the metal material of which the reflective metal film is formed.

In the organic EL display panel of the present invention, the metal oxide film is formed at least partially on a surface of at least one single-film portion in which only the reflective metal film is formed. Here, the single-film portion is at least one of end portions of each of the first electrodes (lower electrodes) in a longitudinal direction of the first electrode. The metal oxide film is provided between a portion of the first electrode and a portion of a second electrode (upper electrode). With this structure, current is prevented from flowing between these portions of the first and second electrodes when the organic EL display panel is driven. As a result, by forming the metal oxide film in such a way, it is possible to prevent anomalous light emission in the light-emitting layer and the short between the first and second electrodes without the pixel definition layer that is provided in the conventional organic EL display panel. Thus, the metal oxide film can function as is it were the pixel definition layer that defines the element forming areas (in which the first electrodes are formed) along a line.

DESCRIPTION OF THE INVENTION

<Embodiments of Invention>

Figure 1:
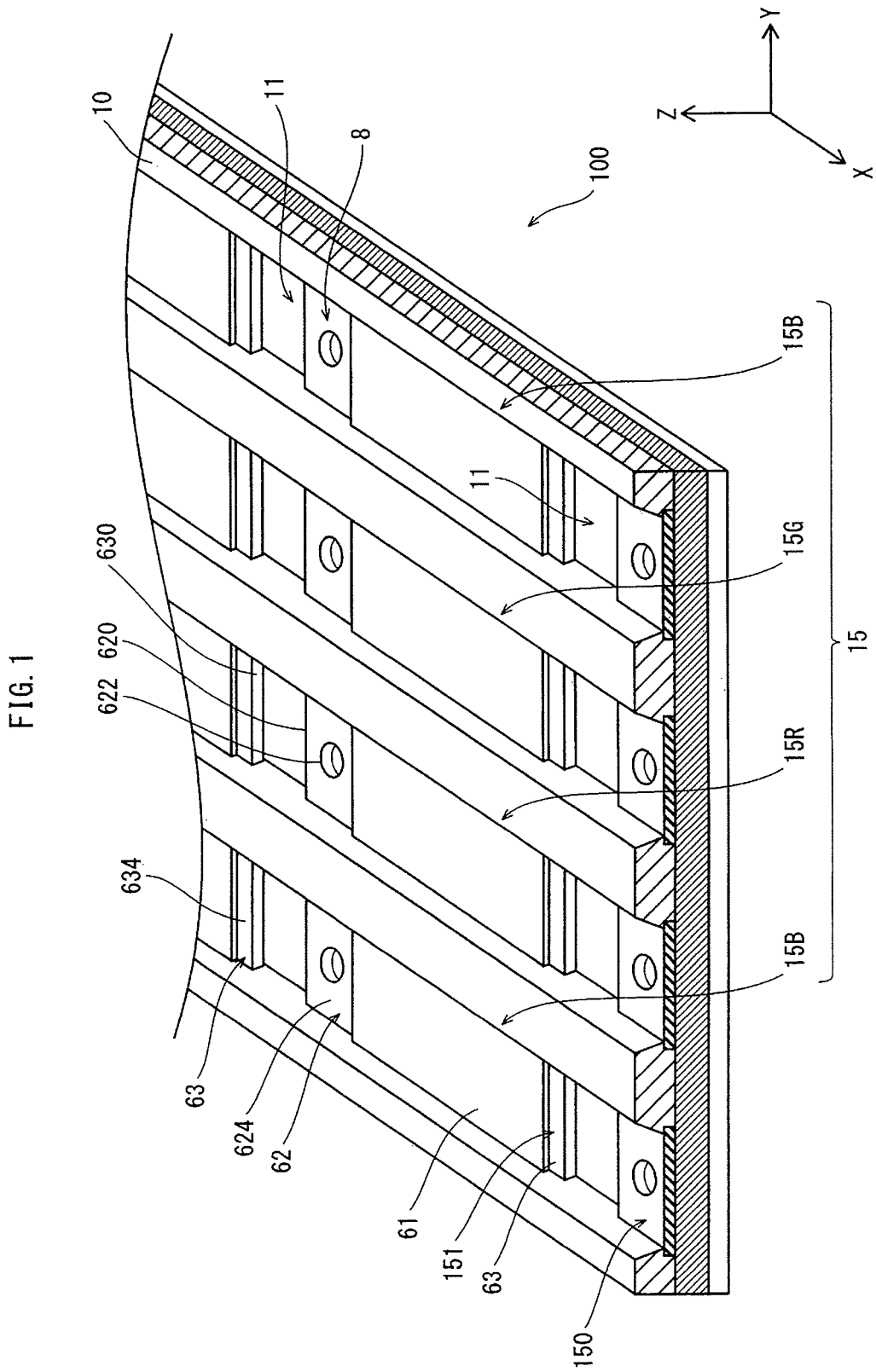
FIG. 1 is a perspective view partially showing a structure of an organic EL display panel 100 of a first embodiment.

In order to solve the above-stated problems, one aspect of the present invention is an organic EL display panel comprising: a substrate; a thin-film transistor layer formed on the substrate; an interlayer insulating film formed above the thin-film transistor layer; a plurality of strip-shaped barrier ribs that are arranged in parallel on the interlayer insulating film; a plurality of first electrode groups, each of which consists of first electrodes that are arranged in a line and is arranged between two adjacent ones of the barrier ribs, each of the first electrodes including a transparent conductive film and a reflective metal film that is formed of a metal material; a plurality of light-emitting layers each formed to cover a different one of the first electrode groups; and a second electrode formed above the light-emitting layers, wherein each of the first electrodes is formed such that: at least one of end portions of the first electrode in a parallel direction with respect to the barrier ribs is a single-film portion in which the transparent conductive film is not formed; and a portion of the first electrode other than the at least one single-film portion is a two-film portion in which the transparent conductive film is layered on the reflective metal film, and a metal oxide film is formed, at least partially on an entire surface of the at least one single-film portion of each of the first electrodes, by partially oxidizing the metal material of which the reflective metal film is formed.

According to the present invention, since the metal oxide film is formed at least on each of: an outer end surface of at least one end portion of each of the first electrodes in the parallel direction with respect to the barrier ribs and an upper surface of the at least one portion of the first electrode. Current does not flow to the metal oxide film. Therefore, current does not flow between a portion of the first electrode and a portion of the second electrode that sandwich the metal oxide film therebetween. As a result, anomalous light emission due to electrical field concentration in the light-emitting layer and the short can be prevented without the pixel definition layer that is provided in the conventional organic EL display panel. Such a metal oxide film functions as if it were the pixel definition layer that defines the organic EL elements arranged in a line.

Here, the metal oxide film is not a deposition, and is formed by partially oxidizing the metal material of which the reflective metal layer is formed (i.e. causing a surface reaction). Specifically, the metal oxide film can be formed in the same process of forming the first electrodes using an etching process and an ashing process. Therefore, according to the present invention, it is possible to provide advantages in terms of production cost since a separate process of forming the metal oxide film is not necessary. Also, according to the present invention, the process of forming the pixel definition layer can be omitted by adopting the metal oxide film. Therefore, production cost can be reduced, and productive efficiency can be improved.

Furthermore, according to the present invention, the pixel definition layer is not formed between adjacent barrier ribs. Therefore, when applying ink containing the organic light-emitting material, the ink can move through a plurality of element forming areas between adjacent barrier ribs (mutual flow). Thus, the thickness of the light-emitting layer can be even in each of the organic EL elements. The applied ink flows until the ink is dried. Therefore, it is not necessary to precisely set an amount of ink to be discharged in order to make the thickness of the light-emitting layer even. Thus, according to the present invention, it is possible to obtain an effect of facilitating adjustment of the thickness of the light-emitting layer.

Furthermore, according to the present invention, the pixel definition layer is not provided. Therefore, when the organic light-emitting material is applied between the adjacent barrier ribs, the organic light-emitting material can move through the pixel forming areas (mutual flow). Thus, the thickness of the light-emitting layer can be even in each of the organic EL elements. According to the present invention, the organic light-emitting material can exhibit its fluidity until the organic light-emitting material is dried. Therefore, it is not necessary to so precisely set the amount of ink to be applied at the time of printing in order to make the thickness of the light-emitting layer even. Therefore, according to the present invention, there is an advantage that the thickness of the light-emitting layer can be easily adjusted.

According to another aspect of the present invention, the metal oxide film may be formed at least on each of: an upper surface of the at least one single-film portion of each of the first electrodes; and an outer end surface of the at least one single-film portion in the parallel direction, the upper surface being uncovered by any of the barrier ribs.

By forming the metal oxide film in such a way, it is possible to form the metal oxide film on most of the entire surface of the at least one single-film portion of each of the first electrodes that is not covered by any of the barrier ribs. Thus, it is possible to successfully obtain effects of preventing the short between the first and second electrodes and preventing the anomalous light emission in the light-emitting layer.

According to yet another aspect of the present invention, in the interlayer insulating film, contact holes may be provided, through each of which a different one of the first electrodes is electrically connected with the thin-film transistor layer, each of the contact holes may be covered with a covering portion of one of the at least one single-film portion of a different one of the first electrodes, and the metal oxide film may be formed on a surface of the covering portion of one of the at least one single-film portion of each of the first electrodes.

By forming the metal oxide film on the covering portion that covers each of the contact holes, an opening edge of the contact hole in which conventionally the anomalous light emission in the light-emitting layer is likely to be caused can be covered by the metal oxide film. In this way, it is possible to successfully obtain an effect of preventing the anomalous light emission effectively.

According to yet another aspect of the present invention, each of the light-emitting layers covering the different one of the first electrode groups may have one color.

With such a structure, the organic EL display panel of the present invention can perform color display.

According to yet another aspect of the present invention, the color of each of the light-emitting layers may be one of red, green, and blue, and consecutive ones of the first electrodes along a direction orthogonal to the parallel direction may be aligned.

According to yet another aspect of the present invention, a thickness of a covering portion of each of the light-emitting layers that covers a different one of the first electrodes may increase, in the parallel direction, from each end of the first electrode towards a center thereof so as to approach asymptotically a constant value, and in each of the first electrodes, in the parallel direction, a length of each of the single-film portions may be as long as at least a length from each of the ends towards the center to a point at which the thickness of the light-emitting layer reaches 90% of an average thickness of the light emitting layer.

By adjusting the length of the single-film portion of the reflective metal film in such a way, such a metal oxide film can be formed at least in an area in which the thickness of the light-emitting layer is likely to be small. Therefore, the anomalous light emission in the light-emitting layer that is possibly caused by the electrical field concentration can be effectively prevented by the metal oxide film.

According to yet another aspect of the present invention, a contact layer may be provided between the interlayer insulating film and each of the first electrodes.

According to yet another aspect of the present invention, the contact layer may be formed using one of titanium, chrome and conductive metal oxide.

According to yet another aspect of the present invention, the reflective metal film may be composed one of aluminum and aluminum alloy, and the metal oxide film may be composed of aluminum oxide. By forming the reflective metal film using such a material, it is possible to obtain the reflective metal film having an excellent reflectivity. In addition to this, it is possible to obtain the metal oxide film having an excellent insulating property.

Yet another aspect of the present invention is an organic EL display device having the above-described organic EL display panel.

Yet another aspect of the present invention may be a method of manufacturing an organic EL display panel, the method comprising: a first step of forming an interlayer insulating film above a thin-film transistor layer formed on a substrate so as to provide a flat upper surface; a second step of disposing, on the interlayer insulating film, a plurality of first electrode groups each having first electrodes that are arranged in a line; a third step of alternately arranging a plurality of strip-shaped barrier ribs with the first electrode groups such that each of the first electrode groups is located between two adjacent ones of the barrier ribs and each of end portions of the first electrodes of the first electrode group in a direction perpendicular to the barrier ribs is covered by a closest one of the adjacent barrier ribs; a fourth step of forming light-emitting layers each covering a different one of the first electrode groups; and a fifth step of forming a second electrode above the light-emitting layers, wherein in the second step, the first electrodes are formed such that: each of the first electrodes includes a transparent conductive film and a reflective metal film that is formed of a metal material; at least one of end portions of each of the first electrodes in a parallel direction with respect to the barrier ribs is a single-film portion in which the transparent conductive layer is not formed; and a portion of each of the first electrodes other than the at least one single-film portion is a two-film portion in which the transparent conductive film is layered on the reflective metal film.

According to yet another aspect of the present invention, after the first step and before the second step, in the interlayer insulating film, contact holes may be provided, through each of which one of the first electrodes is to be electrically connected with the thin-film transistor layer, and in the second step, the first electrodes are connected to the thin-film transistor layer through the contact holes, a portion of one of at least one single-film portion of each of the first electrodes covers a different one of the contact holes, and a metal oxide film is formed on a surface of the portion of one of the at least one single-film portion of each of the first electrodes.

According to yet another aspect of the present invention, in the second step, the first electrodes may be formed after: layering a reflective metal layer and a transparent conductive layer in the stated order on the interlayer insulating film; disposing first resists each on a surface of a different one of first portions of a transparent conductive layer, and disposing second resists each on a surface of a different one of second portions of the transparent conductive layer, the second portions being portions on which the first resists are not disposed, the second resists being larger in thickness than the first resists by a thickness of the transparent conductive layer; etching uncovered portions of the transparent conductive layer on which neither the first resists nor the second resists are disposed; and portions of the reflective metal layer that are under the uncovered portions of the transparent conductive layer; performing a first common process of processing the first and second resists until the first resist has been removed; removing the first portions of the transparent conductive layer that are exposed after removing the first resists; and performing a second common process of removing the second resists and oxidizing upper surface portions of the reflective metal film that are exposed after removing the first portions of the transparent conductive layer.

According to yet another aspect of the present invention, the second resists may be disposed on the second portions of the transparent conductive film in a photosensitive resist method using a half-tone mask.

According to yet another aspect of the present invention, the first common process may be a half-ashing process, and the second common process may be an ashing process.

According to this method, the transparent conductive layer remains on portions of the reflective metal layer above which the second resists are formed. In this way, conductivity can be maintained on surfaces of portions of the reflective metal layers above which the second resists are formed even if the first and second resists are subjected to the ashing process together. Furthermore, it is possible to efficiently oxidize only the surface portions of the reflective metal layer (above which the first resists are to be formed) to be the metal oxide film.

According to yet another aspect of the present invention, in the second step, the reflective metal film may be formed using one of aluminum and aluminum alloy, and a metal oxide film may be formed of an aluminum oxide film.

[First Embodiment]

(Structure of Organic EL Display Panel 100)

Figure 2:
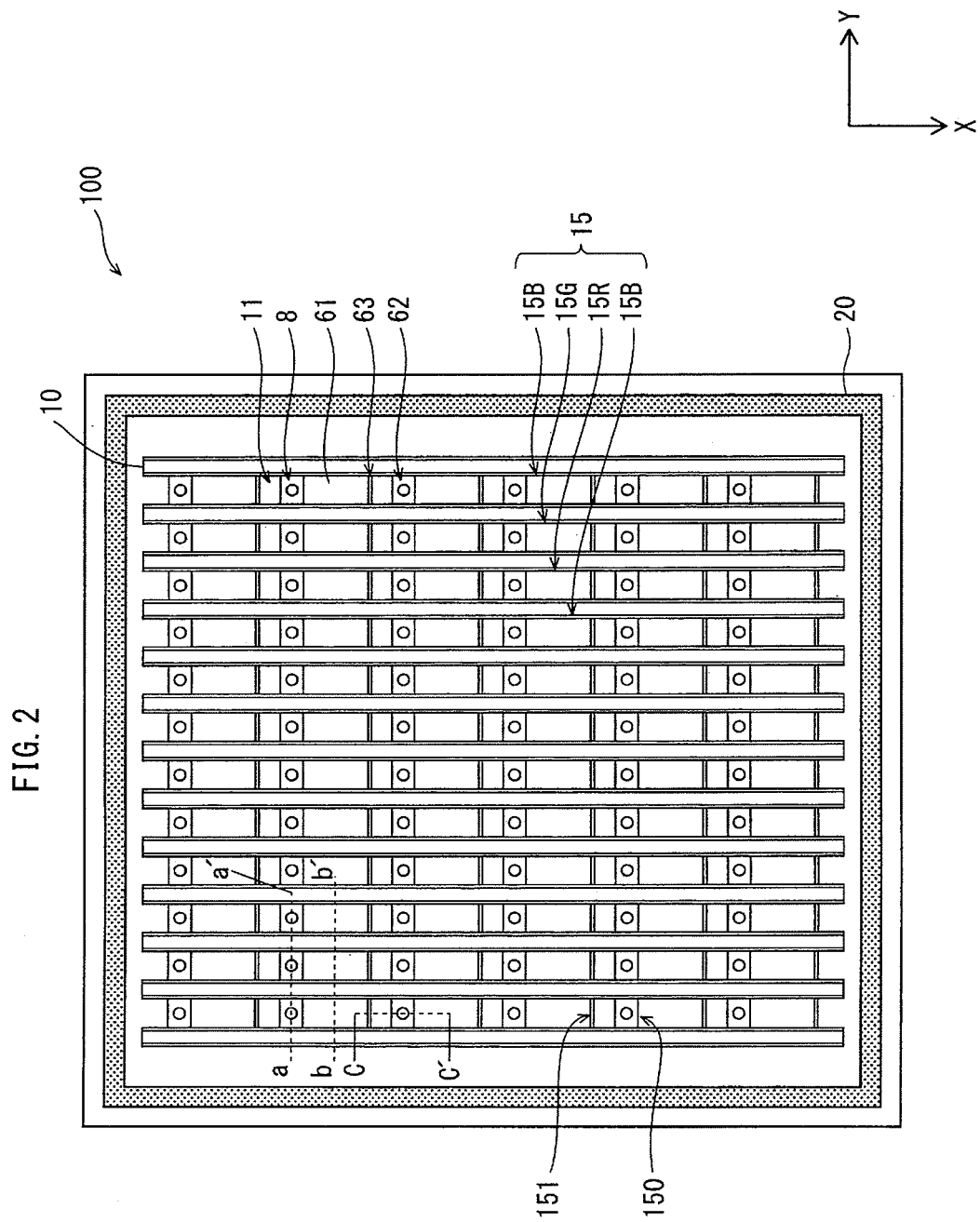
FIG. 2 is a top view showing the structure of the organic EL display panel 100.
Figure 3:
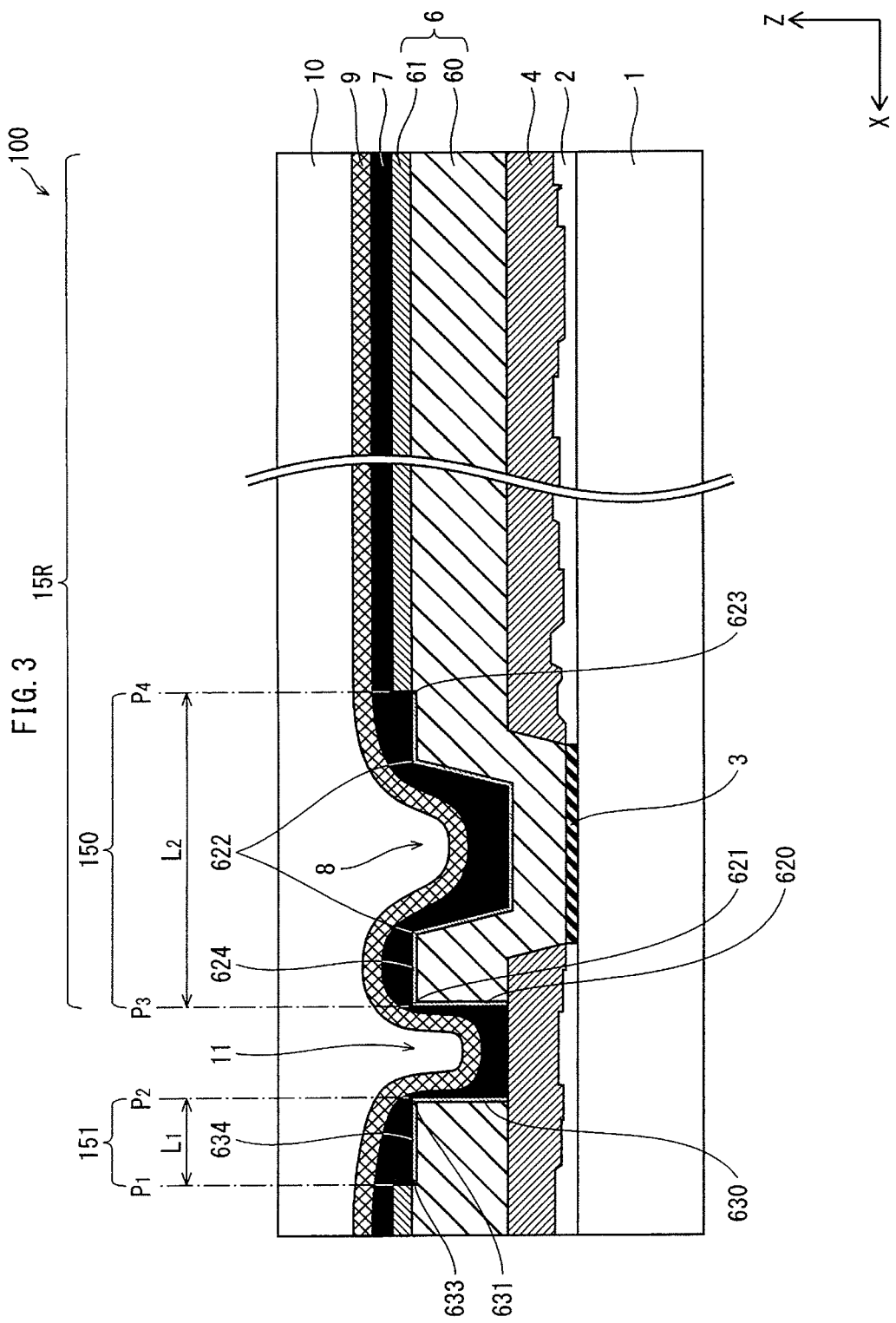
FIG. 3 is a cross-section view partially showing the structure of the organic EL display panel 100.

FIG. 1 is a perspective view partially showing a structure of a top-emission organic EL display panel 100 (hereinafter, simply referred to as a "panel 100") of a first embodiment of the present invention. FIG. 2 shows a front view of the panel 100. Note that an upper electrode and a sealing layer, for example, that are provided above a light-emitting layer 7 are omitted for describing a lower electrode 6, in FIG. 1 and FIG. 2. FIG. 3 is a partial cross-section view (cross section view of c-c' of FIG. 2) that schematically shows the structure of the panel 100.

In the panel 100, organic EL elements 15 (15R, 15B and 15G) each having a light-emitting layer 7 of one of R, G and B colors are disposed in a row direction (a Y direction) as sub pixels. A set of three adjacent sub pixels functions as one pixel.

In the panel 100 as a whole, organic EL elements 15R, 15G and 15B are disposed in a matrix in both the column and row directions (X and Y directions), as shown in the front view of FIG. 2. In the panel 100, a so-called line bank structure is adopted. In the line bank structure, a plurality of line banks that extend in the column direction (X direction) are parallel-arranged in the row direction (Y direction). The organic EL elements having the same color (15R, 15B or 15G) are arranged in a line between each of a plurality of pairs of adjacent banks 10.

Note that it is assumed that the panel 100 is a color-display panel. However, the panel 100 is not limited to this. For example, the panel 100 may be a monochromatic display panel. In this case, all the organic EL elements have the same color (15R, 15G or 15B).

As shown in a cross-section view of FIG. 3, the panel 100 has a TFT substrate 1 (hereinafter, simply referred to as a "substrate 1"). On one surface of the substrate, a TFT wiring part (TFT layer) 2, a planarizing film 4 and a lower electrode (anode) 6 are layered in this order.

Furthermore, the banks 10 are formed on the lower electrode 6 to partition forming areas (openings 13) of the organic EL elements. The light-emitting layer 7 and an upper electrode (cathode) 9 are layered in this order in the opening 13.

The substrate 1 is a base portion of the panel 100, and may be formed with use of one of insulating materials such as alkali-free glass, soda glass, nonluminescent glass, phosphate glass, boric-acid glass, quartz, acrylic resin, styrene resin, polycarbonate resin, epoxy resin, polyethylene, polyester, silicon resin or alumina.

The TFT wiring part 2 (thin-film transistor layer) is formed on the surface of the substrate 1 so as to drive each of the elements 15R, 15G and 15B in the panel as a whole in an active matrix.

The planarizing film (interlayer insulating film) 4 is composed of an organic material such as polyimide having excellent heat-resistance and insulating properties. The planarizing film 4 covers portions of the TFT wiring part 2 except for a power supply electrode (transparent electrode portion) 3 so as to provide a flat upper surface. Note that each portion of the planarizing film 4 that corresponds to the power supply electrode 3 in a thickness direction thereof (in a Z direction) is an opening so as to expose the power supply electrode 3. This forms holes (contact holes 8) each having a round bottom surface. Through the contact holes 8, the TFT wiring part 2 is electrically connected to the lower electrode 6 via the power supply electrode 3.

Note that the contact holes 8 are not prerequisite. Two or more contact holes may be provided in each sub pixel area. Also, the bottom surface of each of the holes does not have to be round, and may be multangular.

The lower electrode 6 is an electrode that has a layer area in which the transparent conductive film 61 is layered on the surface of the reflective metal film 60, and has a certain length. As shown in FIGS. 1 and 2, the lower electrode 6 is provided in each element forming area so as to extend in the column (X) direction. The layer area corresponds to a light-emitting area of each of the organic EL elements 15R, 15B and 15G.

The reflective metal film (reflective anode) 60 supplies power to the light-emitting layer. Also, the reflective metal film 60 is formed with use of a metal material (aluminum or aluminum alloy) having a great visible light reflectance so as to efficiently extract light emitted thereabove (light emitted in the light-emitting layer). The "aluminum alloy" is alloy formed by adding, to aluminum, at least one of iron, copper, manganese, zinc, nickel, magnesium, palladium, cobalt and neodymium. The reflective metal film 60 is formed to have a recess in the thickness direction of the panel 100 (Z direction) when viewed cross-sectionally such that most of a lower surface of the reflective metal film 60 is in contact with the surface of the planarizing film 4 while a portion of the lower surface of the reflective metal film 60 facing the contact hole 8 is in contact with the power supply electrode 3.

The transparent conductive film 61 is formed with use of a known transparent conductive material such as ITO or IZO. The transparent conductive film 61 covers the reflective metal film 60 so as to block air and the like in the atmosphere. The transparent conductive film 61 is provided to prevent decrease in reflectance and conductivity of the reflective metal film 60 due to formation of unnecessary films. In general, the transparent conductive film 61 is formed so as to cover the reflective metal film 60 as a whole. However, in the panel 100, the transparent conductive film 61 is not provided at least on a surface of an end portion of the reflective metal film 60 of the lower electrode 6 covering the contact hole 8 and a surface of the other end portion of the reflective metal film 60 of the lower electrode 6.

Accordingly, single-film portions 150 and 151 of the reflective metal film 60 are provided in pixel definition areas other than the light-emitting areas of the lower electrode 6 along the column (X) direction, in the panel 100. Also, metal oxide films 62 and 63 are provided on the surfaces of the single-film portions 150 and 151 of the reflective metal film 60, respectively. Here, each of the metal oxide films 62 and 63 is formed by partially oxidizing a metal (i.e. aluminum or aluminum alloy) of which the reflective anode is formed. The metal oxide films 62 is composed of at least an end surface portion 620 and an upper surface portion 624, and the metal oxide film 63 is composed of at least an end surface portion 630 and an upper surface portion 634.

Each of these metal oxide films 62 and 63 is formed of aluminum oxide ($Al_2O_3$), and has an insulating property. Therefore, since a carrier does not flow, in the thickness (Z) direction, to the single-film portions 150 and 151 of the reflective metal film 60 covered by the metal oxide films 62 and 63. Thus, these single-film portions 150 and 151 function as non-luminescent areas (i.e. pixel definition areas) at which the light-emitting layer 7 is not caused to emit light.

Each of the banks (ribs) 10 is formed using an organic material having an insulating property. Examples of the organic material used for forming the banks are acrylic resin, polyimide resin and novolac-type phenolic resin. At least an surface of each of the banks 10 has a water repellent property. In order for the panel 100 to have the banks 10 having the line bank structure, the banks is trapezoidal when cross-sectionally viewed in a width (Y) direction, and extends in the X direction so as to be strip-shaped. In the panel 100, the banks 10 are arranged at a predetermined pitch in the width (Y) direction.

The light-emitting layer 7 is formed on the surface of the lower electrode 6, using a predetermined organic light-emitting material so as to correspond to one of R, G and B colors. In the panel 100, the light-emitting layer 7 is formed to cover the element-forming areas between each pair of the banks 10. A known material can be used as the organic light-emitting material. To give a concrete example, fluorescent materials disclosed in Japanese Patent Application Publication No. H5-163488 that can be used for the organic EL layer are: oxinoid compounds, perylene compounds, coumalin compounds, azacoumalin compounds, oxazole compounds, oxadiazole compounds, perinone compounds, pyrrolopyrrole compounds, naphthalene compounds, anthracene compounds, fluorene compounds, fluoranthene compounds, tetracene compounds, pyrene compounds, coronene compounds, quinolone compounds, azaquinolone compounds, pyrazoline derivatives, pyrazolone derivatives, rhodamine compounds, chrysene compounds, phenanthrene compounds, cyclopentadiene compounds, stilbene compounds, diphenylquinone compounds, styryl compounds, butadiene compounds, dicyanomethylenepyran compounds, dicyanomethylenethiopyran compounds, fluorescein compounds, pyrylium compounds, thiapyrylium compounds, selenapyrylium compounds, telluropyrylium compounds, aromatic aldadiene compounds, oligophenylene compounds, thioxanthene compounds, anthracene compounds, cyanine compounds, acridine compounds, metal complexes containing 8-hydroxyquinoline derivatives, metal complexes containing 2-bipyridine derivatives, group III metal complexes containing Schiff base, metal complexes containing oxine, rare earth metal complexes, etc.

The upper electrode 9 is a cathode, and is formed using ITO (Indium Tin Oxide) and IZO (Indium Zinc Oxide), for example. Since the panel 100 is the top-emission type organic EL display panel, the upper electrode 9 needs to be formed using a light-transmitting material.

Note that although not depicted in FIG. 1 to FIG. 3, the known sealing layer is provided on the upper electrode 9. The sealing layer is formed using materials such as SiN (Silicon Nitride) or SiON (Silicon Oxynitride) and suppresses deterioration of the light-emitting layer 7 due to exposure to moisture and air, for example. Note that the sealing layer is also formed using a light-emitting material.

(Structural Example of Display Device)

Figure 11:
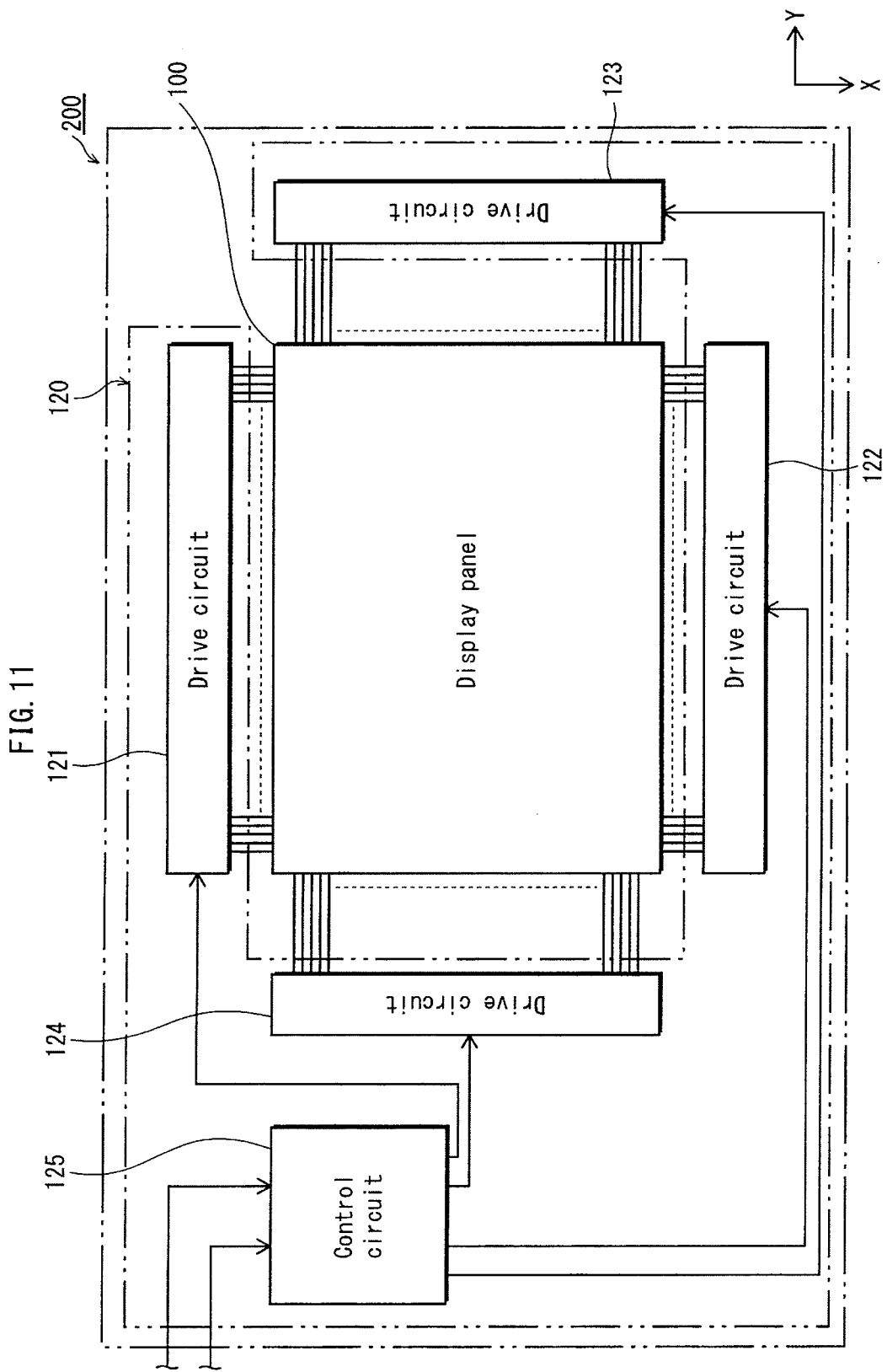
FIG. 11 shows a structure of an image display device using the organic EL display panel 100.

FIG. 11 shows a structure of a display device 200 using the panel 100.

The display device 200 is composed of the panel 100 and a drive control unit 120 connected thereto. The drive control unit 120 is composed of four drive circuits 121 to 124 and a control circuit 125.

Figure 12:
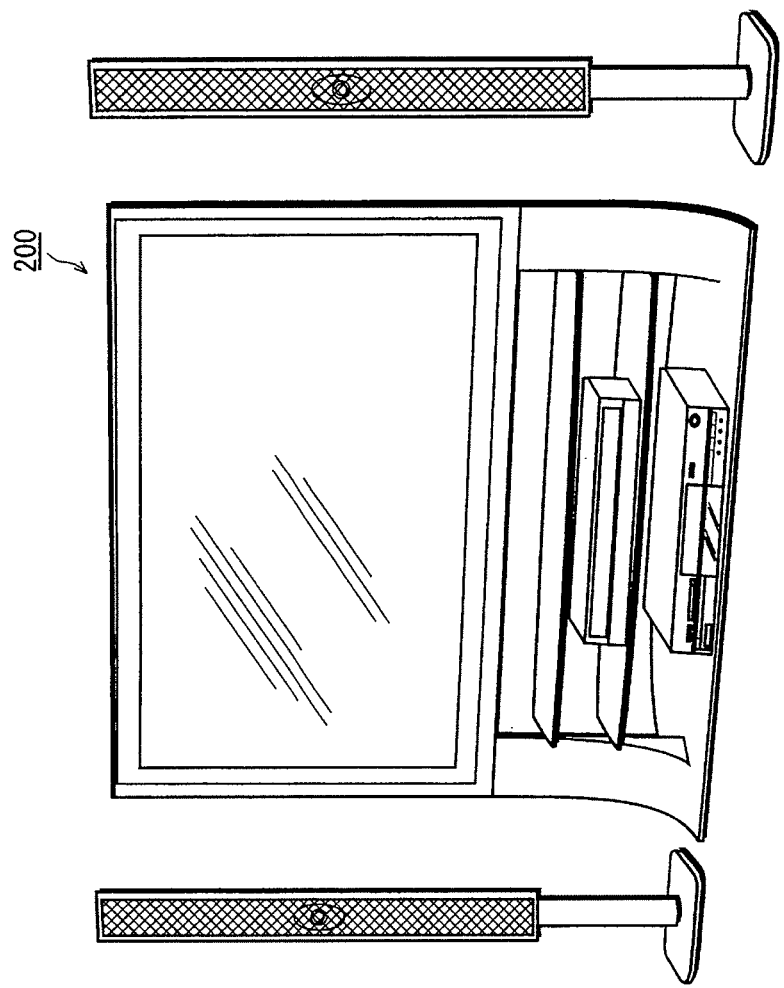
FIG. 12 shows an example of a usage form of the image display device.

FIG. 12 is an aspect of an example of a TV system using the display device 200.

In each of the organic EL elements 15R, 15G and 15B formed between each pair of the adjacent banks 10 in the panel 100 having the above-described structure, the metal oxide films 62 and 63 are respectively formed on the single-film portions 150 and 151 of the reflective metal film 60 that correspond to the pixel definition areas. Here, each of the metal oxide films 62 and 63 is formed of a metal material of which the reflective metal film 60 is formed, and has an insulating property. Since the reflective metal film 60 does not exhibit its conductive property in areas in which the metal oxide films 62 and 63 are formed, a carrier does not flow to the light-emitting layer 7 when the panel 100 is driven.

As shown in FIG. 3, the metal oxide film 62 has at least the end surface portion 620 and the upper surface portion 624, and the metal oxide film 63 has at least the end surface portion 630 and the upper surface portion 634. In particular, when the metal oxide film 62 is formed to cover an edge portion 621 of the upper surface portion 624 and an edge 622 of the contact hole 8, and the metal oxide film 63 is formed to cover an edge portion 631 of the upper surface portion 634 of the reflective metal film 60, anomalous light emission due to the electrical field concentration can be prevented even if the thickness of the light-emitting layer 7 is extremely small in areas in which the metal oxide films 62 and 63 are formed. Even if the light-emitting layer 7 is cut in these areas, it is possible to prevent unnecessary short (see FIG. 7 and FIG. 8) that possibly occurs between the lower electrode 6 and the upper electrode 9.

With such a structure, the metal oxide films 62 and 63 can function as if each of these films were the conventional pixel definition layer. Also, it is possible to obtain a light-emitting property that is as preferable as a light-emitting property when the pixel definition layer is provided.

Note that the metal oxide films 62 and 63 in the panel 100 are not depositions that are provided separately from the reflective metal film 60, but are formed by partially oxidizing the metal material of which the reflective metal film 60 is formed (specifically, a surface portion of the reflective metal film 60). These metal oxide films 62 and 63 are formed by exposing the reflective metal film 60 to an oxidizing atmosphere for removing resists in an ashing process in a process of forming the lower electrode 6 using a photosensitive resist method. The details of this process are described later in a manufacturing method. Accordingly, the metal oxide films 62 and 63 will not be cut unlike the pixel definition layer formed in the coating process. The metal oxide films 62 and 63 are formed efficiently and evenly with respect to a predetermined surface of the reflective metal film 60 exposed to the oxidizing atmosphere. Therefore, the effects of reliably preventing the short and suppressing the anomalous light emission due to the electrical field concentration can be expected compared to the conventional technology in which the pixel definition layer is formed. Also, since a separate process for forming the metal oxide films 62 and 63 is not necessary, it is possible to obtain an excellent productivity and provide an excellent possibility. The advantages regarding the productivity are very effective when combined with the effect of reducing the number of processes achieved by eliminating the use of the pixel definition layer.

Furthermore, since the pixel definition layer is not used in the panel 100, ink can move through the element forming areas in the column (X) direction (mutual flow). Here, the ink includes the organic light-emitting material applied between the adjacent banks 10 in one of the manufacturing processes. This is how the light-emitting layers 7 each having an even thickness is formed. This makes it possible to exhibit an excellent image display performance with which uneven luminescence is small in the entire panel 100.

Figure 7:
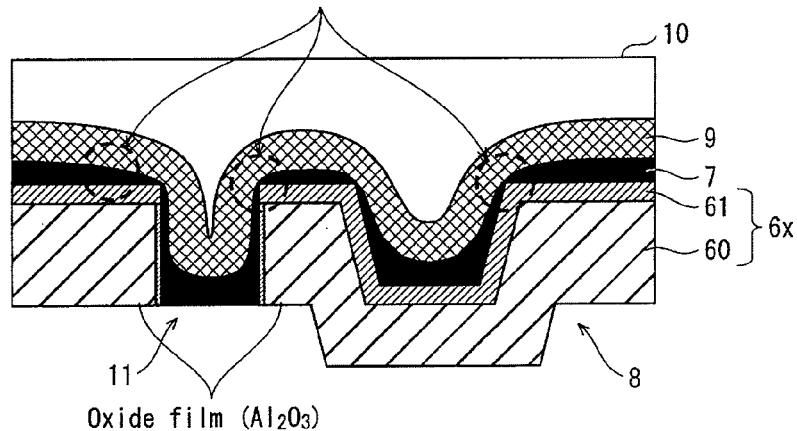
FIG. 7 is a cross-section view showing conventional problems when a pixel definition layer is not provided.
Figure 8:
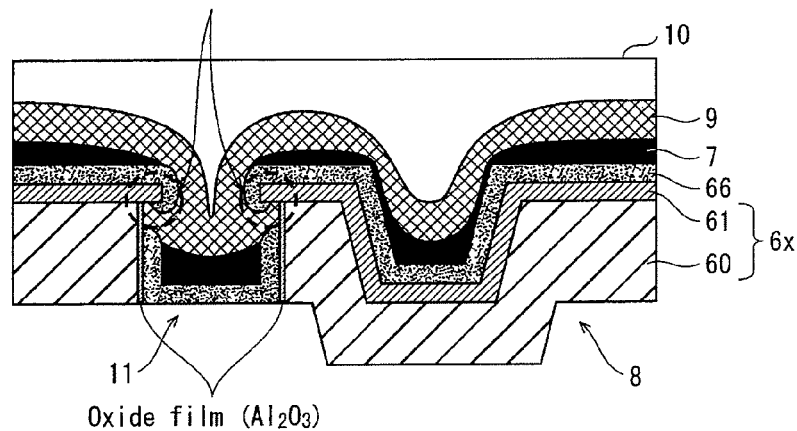
FIG. 8 is a cross-section view showing conventional problems when a pixel definition layer is provided.

Note that, even in the conventional organic EL display panel, an aluminum oxide film is formed on each end surface of the reflective metal film 60 that face the gap 11 in some cases due to natural oxidization, for example, as shown in FIG. 7 and FIG. 8, in the process of forming the lower electrode 6X. However, this aluminum oxide film cannot prevent the short due to the current that has passed through the transparent conductive film disposed on a surface of the reflective metal film (FIG. 8). Also, it is necessary to provide a pixel definition layer on the reflective metal film for preventing the anomalous light emission. In the panel 100, on the other hand, the metal oxide films are provided at least on an outer end surface and an upper surface of at least one of the end portions of the metal reflective film 60 so as to reliably prevent the short and the anomalous light emission, and the use of the pixel definition layer is eliminated. Thus, the panel 100 is very different in these points from the conventional panel.

(Regarding Areas in which Metal Oxide Films are Formed)

As described in the above, a carrier does not flow to the single-film portions 150 and 151 (in which the metal oxide films 62 and 63 are formed respectively) in the thickness direction of the panel 100 (X direction). Therefore, theses single-film portions 150 and 151 are non-luminescent areas. Therefore, when the areas in which the metal oxide films 62 and 63 are formed are too large, the size of the light-emitting areas decreases. This affects the image display performance. Also, when the areas in which the metal oxide films 62 and 63 are formed are too small, functions of the conventional pixel definition layer (a pixel separation function, an anomalous light emission prevention function and a short prevention function) cannot be fulfilled. Accordingly, it is important that the metal oxide films 62 and 63 are formed in appropriate areas of at least the upper surface of the reflective metal film 60 in the panel 100.

Here, the light-emitting layer 7 scans in the longitudinal direction of the banks (X direction) with use of an inkjet head (not depicted) based on the inkjet method. The ink containing the organic light-emitting material is applied between the pair of the adjacent banks 10 from the inkjet head. Then, the light-emitting layer 7 is formed after a solvent in the ink has been dried. Thus, the thickness of the light-emitting layer 7 increases from an end point P2 (P3) towards a central point P1 (P4) so as to asymptotically approach a constant value, due to process characteristics. In areas in which the thickness of the light-emitting layer 7 is small, the anomalous light emission and the short are likely to occur. Therefore, it is necessary to prevent these problems.

Therefore, it is necessary to ensure that a length L1 (L2) of the single-film portion of the reflective metal film 60, on a surface of which the metal oxide film 62 (63) is to be provided, is as long as a length from the point P2 (P3) to a position of the inner ends 623 (633). Here, the point P2 (P3) which is a start point corresponding to a point of the edge portion 621 (631), and the edge portion 623 (633) is where the thickness is asymptotic to the constant value. Specifically, it is preferable that the length L1 (L2) of the single-film portion is at least a length from the point P2 (P3) which is the start point corresponding to a point of the edge portion 621 (631) towards the center to a point at which the thickness of the light-emitting layer 7 reaches 90% of the average thickness of the light-emitting layer 7 (a electrical field change rate of the light-emitting layer 7 having an average thickness with respect to an electrical field is 10% or more).

Note that the anomalous light emission due to the electrical filed concentration and the short can be prevented in areas around the lower electrode 6 in which these problems are conventionally likely to occur, by providing the metal oxide films 62 and 63 such that the upper surface portions 624 and 634 cover at least step portions of the reflective metal film 60 (the edge portions 621 and 631 in a vicinity of the end portions P2 and P3, and the edge 622 of the contact hole 8). However, in order to obtain the best effects from the metal oxide films 62 and 63, each of the upper surface portions 624 and 634 should be continuously formed so as to occupy a large portion of the entire single-film portions having the single-film length L1 and L2 respectively, as shown in the above.

Note that it is necessary to form, in any of the cases: at least the end surface portion 620 of the metal oxide film 62 and the upper surface portion 624 of the metal oxide films 62, on surfaces of the single-film portion 150; and at least the end surface portion 630 of the metal oxide film 63 and the upper surface portion 634 of the metal oxide films 63, on surfaces of the single-film portions 151. Here, the end surface portions 620 and 630 of the metal oxide films 62 and 63 that oppose one another across the gap 11 along the column (X) and the single-film portions 150 and 151 are not covered by any of the banks 10.

Figure 5:
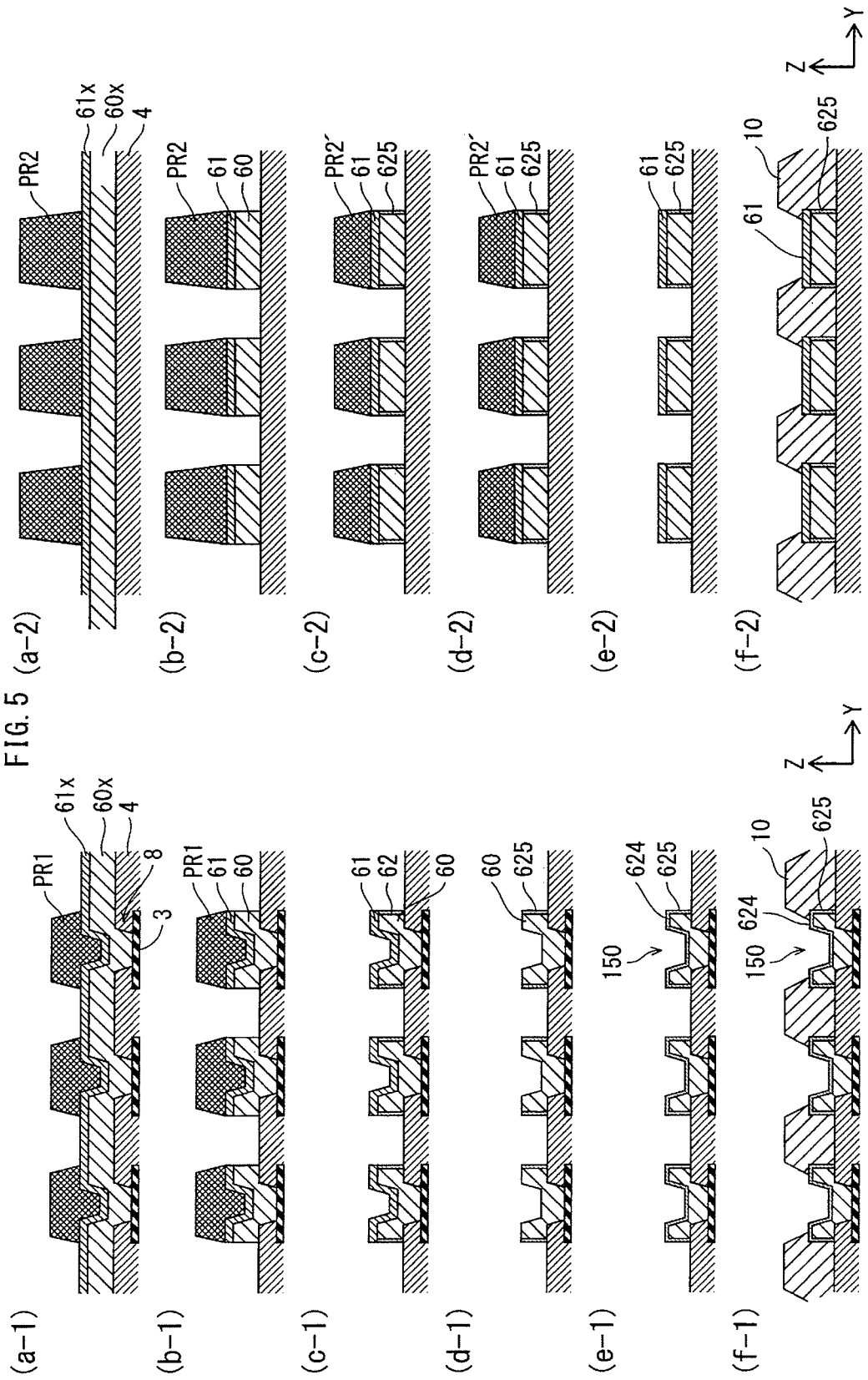
FIG. 5 shows processes of manufacturing elements around a lower electrode (anode) of the present invention.

Also, both of lateral surface portions of the reflective metal film 60 in the width direction thereof (Y direction) are covered by the banks 10. Therefore, the metal oxide film does not necessarily have to be formed on these portions. (f-1) and (f-2) of FIG. 5 shows a process of forming the metal oxide films of the reflective metal film 60 for both of lateral surface portions 625 in the Y direction.

[Second Embodiment]

The following describes a second embodiment of the present invention, focusing on differences from the first embodiment.

The panel 100 of the first embodiment has a structure in which the reflective metal film 60 is formed directly on the planarizing film 4. However, the structure of the panel is not limited to this. A separate conductive film may be formed between the planarizing film 4 and the reflective metal film 60.

Figure 4:
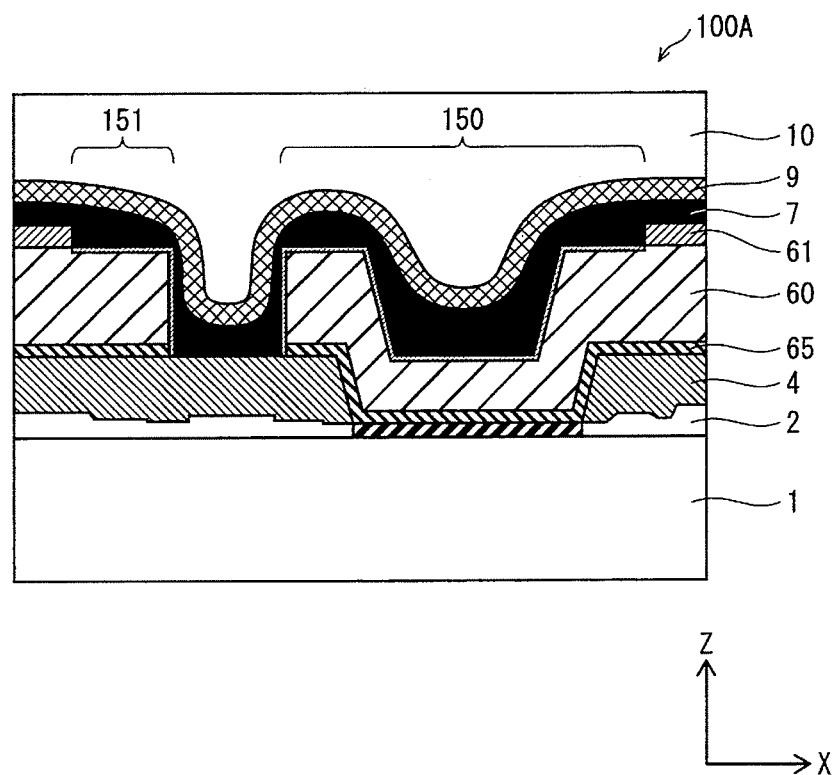
FIG. 4 is a cross-section view partially showing a structure of an organic EL display panel 100A of a second embodiment in which a contact layer is provided.

Specifically, a contact layer 65 may be formed between the planarizing film 4 and the reflective metal film 60 as shown in the cross-section view of a panel 100A of FIG. 4. The contact layer 65 is formed using a metal such as Ti or Cr, or a conductive metal oxide such as ITO or IZO. In this way, the reflective metal film 60 can be adhered tightly to an upper surface of the planarizing film 4 effectively.

The panel 100A having such a structure can achieve effects of preventing the short between the single-film portion 150 (151) of lower electrode 6 and a portion of the upper electrode 9 thereabove, and avoiding the anomalous light emission of the light-emitting layer 7, by providing the metal oxide films 62 and 63, as with the panel 100. Also, since the fluidity of the ink applied between the adjacent banks 10 can be ensured by eliminating the use of the pixel definition layer, the thickness of the light-emitting layer 7 can be even in each of the organic EL elements 15R, 15B and 15G. Thus, the excellent image display performance can be expected.

<Method of Manufacturing Organic EL Display Panel of Present Invention>

The organic EL display panel of the present invention can be manufactured by the following manufacturing method.

[First Process: Planarizing Film Forming Process]

Firstly, the substrate 1 is prepared, and is placed in a chamber of a spattering film generation device. Subsequently, a predetermined spattering gas is filled in the chamber based on the reactive spattering method so as to form the TFT wiring part 2 and the power supply electrode 3 on the substrate 1 (see FIG. 3).

Then, the upper surfaces of the TFT wiring part 2 and the power supply electrode 3 are spin-coated with known photosensitive resists (e.g. siloxane copolymer photosensitive polyimide) having an excellent insulating property. Based on the photoresist method, the spin-coated photosensitive resists are subjected to a photoprocess via a pattern mask, and the unnecessary resists are removed. This is how the planarizing film 4 having a thickness of 4 μm is formed (FIG. 4). In this process, the contact holes 8 through which the lower electrode 6 and the power supply electrode 3 are electrically connected to one another are formed in the planarizing film 4 at a predetermined interval in the column (X) direction, with use of the pattern mask. By adopting the photoresist method using the pattern mask, the planarizing film 4 and the contact holes 8 can be formed in the same process.

Note that the method of forming the contact holes 8 is not limited to this. For example, the contact holes 8 may be formed by uniformly forming the planarizing film 4, and then removing (using an etching method) predetermined portions of the planarizing film 4.

[Second Process: Lower Electrode Forming Process]

The following describes a lower electrode forming process which is one of main characteristics of the present invention. This process is performed by taking the following sub steps in order.

Figure 6:
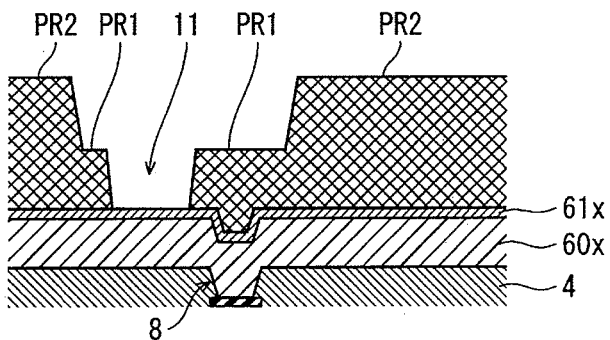
FIG. 6 shows processes of manufacturing elements around the lower electrode (anode) of the present invention.
Figure 6:
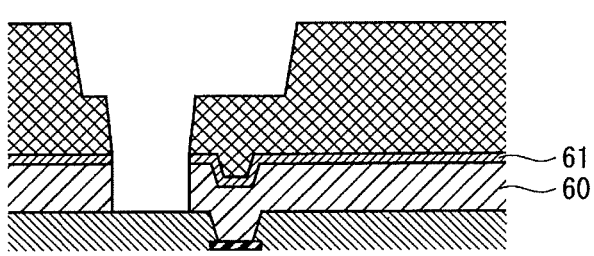
Figure 6:
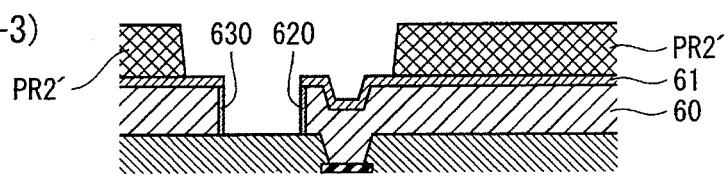
Figure 6:
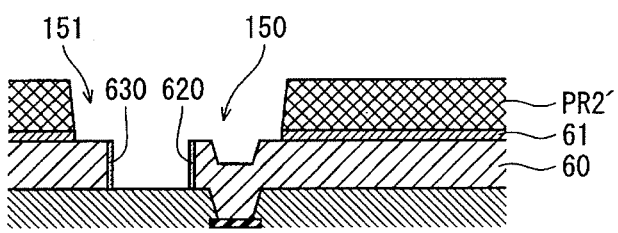
Figure 6:
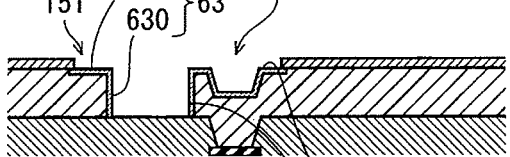
Figure 6:
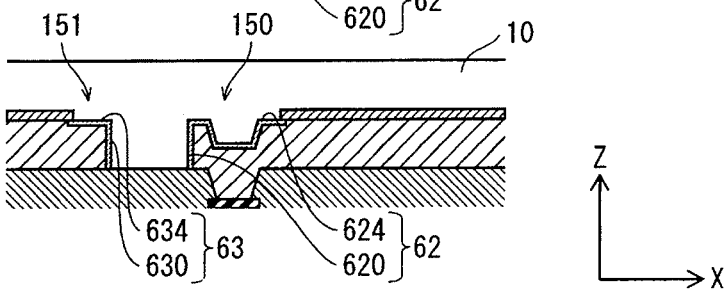

(a-1) to (f-1) of FIG. 5, (a-2) to (f-2) of FIG. 5 and (a-3) to (f-3) of FIG. 6 are shown as cross-section views of a-a' of FIG. 2 (cross-section views in the Y direction across the contact holes), cross-section views of b-b' of FIG. 2 (cross-section views of the lower electrode central area in the Y direction and cross-section views of c-c' (cross-section views in the X direction). This describes the process of forming the lower electrode.

(Sub Steps 2 to 1: Conductive Layer Layering Step)

A reflective metal layer 60X is formed on the planarizing film 4 based on a vacuum evaporating method or the spattering method. Here, the reflective metal layer 60X is formed using an aluminum material or an aluminum alloy material having a thickness of approximately 50 nm. At this time, the reflective metal layer 60X is electrically connected to the power supply electrode 3 of the TFT layer through the contact holes formed in the planarizing film 4. Furthermore, the transparent conductive layer 61X is layered on the upper surface of the reflective metal layer 60X in the same method of forming the reflective metal layer 60X. Here, the transparent conductive layer 61X is formed using ITO or IZO.

Note that when the panel 100A of the second embodiment is manufactured, the material for forming the contact layer is placed on the planarizing film 4 first based on the vacuum evaporating method or the spattering method. Here, examples of the materials for forming the contact layer are metal such as Ti or Cr, and conductive metal oxide such as ITO or IZO. Subsequently, the reflective metal layer 60X is formed in the above-described method.

(Sub Step 2-2: Resist Arrangement Step)

Next, a photosensitive resist is arranged uniformly on the transparent conductive layer 61X. A predetermined mask is placed on the photosensitive resist. Then, patterning of the photosensitive resist is performed according to a pattern of the lower electrode 6 to be formed, based on the photolithographic method.

This patterning is performed as shown in (a-1) and (a-2) of FIG. 5 and (a-3) of FIG. 6. That is, in each of the organic EL elements, a first resist PR1 having a predetermined thickness is placed in a given area of the surface of the transparent conductive film on which the oxide film is to be formed. A second resist PR2 is placed in an area of the surface of the transparent conductive film other than the given area (i.e. a light-emitting area in the panel 100). Here, the second resist PR2 has larger thickness than the first resist PR1 by the thickness of the transparent conductive film. These resists PR1 and PR2 can be formed in the same process by using a known half-tone mask after placing the same resist materials at the same time. Also, it is possible to form the second resists PR2 by partially placing another resist on the first resists PR1 after placing the first resists PR1.

(Sub Step 2-3: Etching Step)

After placing the resists PR1 and PR2 as described above, the following is performed as shown in (b-1) and (b-2) of FIG. 5. That is, portions of the reflective metal layer 60X and portions of the transparent conductive layer 61X that are not covered by the resists PR1 and PR2 (portions corresponding to areas in which the gaps 11 are formed) are removed in a wet etching process, and are subjected to the patterning. Here, the wet etching process can be executed under the following conditions, for example:

Etching solution: General-purpose mixed acid (phosphoric acid+nitric acid+acetic acid)
Temperature: 30° C. or 40° C.
Time: Around three minutes (etching speed: 100 nm/min)
Method: Dipping method In this process, layer patterns for the reflective metal layer 60X and the transparent conductive layer 61X are formed such that a plurality of element forming areas each are formed in a line and the lines of the element forming areas are formed in parallel.

(Sub Step 2-4: First Common Processing Step)

The ashing process of the first resist PR1 and a process of forming the metal oxide film are performed in a common processing step.

Specifically, an oxygen plasma ashing process is executed for the first resist PR1 and the second resist PR2 until the first resist PR1 is removed.

The following describes setting conditions of the oxygen plasma ashing process. Note that it is needless to say that such setting is merely one example. Therefore, processing time may be adjusted by changing a gas flow rate, a high-frequency power source density or the like.

Equipment: ICP etching device
High-frequency power source density: 3 W/cm$^2$
Frequency: 13.56 MHz
Pressure in resist etching: 13 Pa
Gas flow rate of O$_2$: 1700 sccm With the above setting conditions, the resist is etched (removed) at a speed of approximately 400 nm/min. Thus, the first resists are removed as shown in (c-1) and (c-2) of FIG. 5 and (c-3) of FIG. 6, and the transparent conductive films 61 and the reflective metal films 60 that are covered by the resists PR1 are exposed. Also, a portion of each of the second resist PR2 is removed (half-ashed). Here, the removed portion of each of the second resists PR2 has a height of the first resist PR1. The resultant resist is a second resist PR2'.

Due to the first and second resists PR1 and PR2 being subjected to the oxygen plasma ashing process, end surface portions facing each of the gaps 11 and lateral surface portions of the reflective metal film 60 are oxidized so as to form the metal oxide films (aluminum oxide films) 62 and 63. Here, each of the metal oxide films 62 and 63 is formed of the metal material (aluminum or aluminum alloy) of which the reflective metal film 60 is formed. (c-1) and (c-2) of FIG. 5 show how the lateral surface portion 625 is formed in the width direction thereof (Y direction). (c-3) of FIG. 6 shows how the end surface portions 620 and 630 are formed.

Note that the metal oxide films 62 and 63 each having a stable form and having a thickness of approximately 10 nm are formed by performing the above-described ashing process on the surface of the reflective metal film 60 for more than 60 seconds.

(Sub Step 2-5: Transparent Conductive Film Removal Step)

Next, the exposed portions of the transparent conductive film 61 are subjected to the wet etching process so as to be removed, as shown in (d-1) and (d-2) of FIG. 5 and (d-3) of FIG. 6. Thus, the single-film portions 150 and 151 are formed. The upper surfaces of the reflective metal films 60 covered by the transparent conductive films 61 are partially exposed, as shown in (d-1) of FIG. 5 and (d-3) of FIG. 6.

(Sub Step 2-6: Second Common Processing Step)

The oxygen plasma ashing process is executed under the same setting conditions as those shown in the above step 2-4.

The resultant second resists PR2' are removed, and the upper surface portions of the reflective metal films 60 exposed in the sub step 2-5 are oxidized to form, on the oxidized upper surfaces, the metal oxide films 62 and 63 (upper surface portions 624 and 634). Thus, all of the metal oxide films 62 and 63 to be formed on the single-film portions 150 and 151 of the lower electrode 6 are provided as shown in (e-1) and (e-2) of FIG. 5 and (e-3) of FIG. 6. Since the metal oxide films 62 and 63 are formed in the oxygen plasma ashing process which is a dry gas process, the metal oxide films 62 and 63 can be successfully formed on the surfaces of the reflective metal films 60 without any absent parts. Accordingly, there are no cuts unlike the conventional pixel definition layer. Therefore, it is possible to remarkably reduce the possibility that the short occurs due to the formation of the current path between the upper electrode 6 and the lower electrode 9.

Note that when the reflective metal film 60 is exposed to the oxidizing atmosphere such as the air, the metal oxide films (Al$_2$O$_3$) formed by natural oxidization are each formed to have a thickness of approximately 5 to 6 nm. It is possible to obtain a certain effect that is similar to the effect obtained from the conventional pixel definition layer, with use of the metal oxide film formed by the natural oxidization. In order to obtain a more reliable effect, it is preferable to form the metal oxide film having an enough thickness (of 10 nm or larger as described in the above). Therefore, it is preferable that the metal oxide films 62 and 63 are formed with use of the above-described oxygen plasma ashing process.

Also, the thickness of the metal oxide films 62 and 63 should be approximately 10 nm as described in the above. However, the thickness of the metal oxide films 62 and 63 is not limited to this. Therefore, the thickness may be larger than 10 nm. In view of the realistic oxygen plasma ashing process, it is preferable that the thickness is set to approximately 15 to 20 nm, in particular. By increasing the volume of each of the metal oxide films 62 and 63 respectively formed on the single-film portions 150 and 151, it is possible to reduce unnecessary power distribution to the single-film portions 150 and 151. With such a structure, an increase in the light-emitting efficiency of the panel 100 can be expected. The adjustment of the thickness of the metal oxide films 62 and 63 may be controlled comparatively easily by adjusting the ashing process time, for example.

In the above exemplary sub step 2-5, a portion of the transparent conductive film 61 that is exposed after removing the first resist PR1 has been removed, and then the metal oxide films 62 and 63 are formed on the exposed surfaces of the single-film portions 150 and 151 of the reflective metal films 60, respectively. However, the present invention is not limited to this process.

According to another exemplary process, the metal oxide films 62 and 63 may be formed by forming only the reflective metal film 60 on each of the planarizing films 4 after the first process, and oxidizing surface portions of the single-film portions 150 and 151. Subsequently, the transparent conductive film 61 is formed on each of the reflective metal films 60. In this way, the transparent conductive films 61 can be formed without being electrically connected to the upper surface portions 624 and 634 of the single-film portions 150 and 151 of the transparent conductive films 61.

Alternatively, the transparent conductive films 61 may be formed on the upper surface portions 624 and 634 of the single-film portions 150 and 151 temporarily after the first process. Then, the portions of the transparent conductive films 61 on the single-film portions 150 and 151 may be removed (using the etching method).

Alternatively, according to another exemplary process, the first resists PR1 and the second resists PR2 may be formed directly on the reflective metal layer 60X without forming the transparent conductive layer 61X in (a-1) and (a-2) of FIG. 5 and (a-3) of FIG. 6. Subsequently, steps (c-1) and (c-2) of FIG. 5 and (c-3) of FIG. 6 are executed. In the oxygen plasma ashing process, portions of the reflective metal layer 60X, surfaces of which are exposed after removing the resist PR1, are oxidized. In this method, the transparent conductive layer 61X does not exist. Therefore, portions of the surface portions of the reflective metal layer 60X exposed after removing the resist PR1 may be oxidized in the same process of removing the resist PR1 in the oxygen plasma ashing process. Therefore, this method is efficient.

(Comparison with Conventional Lower Electrode Forming Step)

Figure 9:
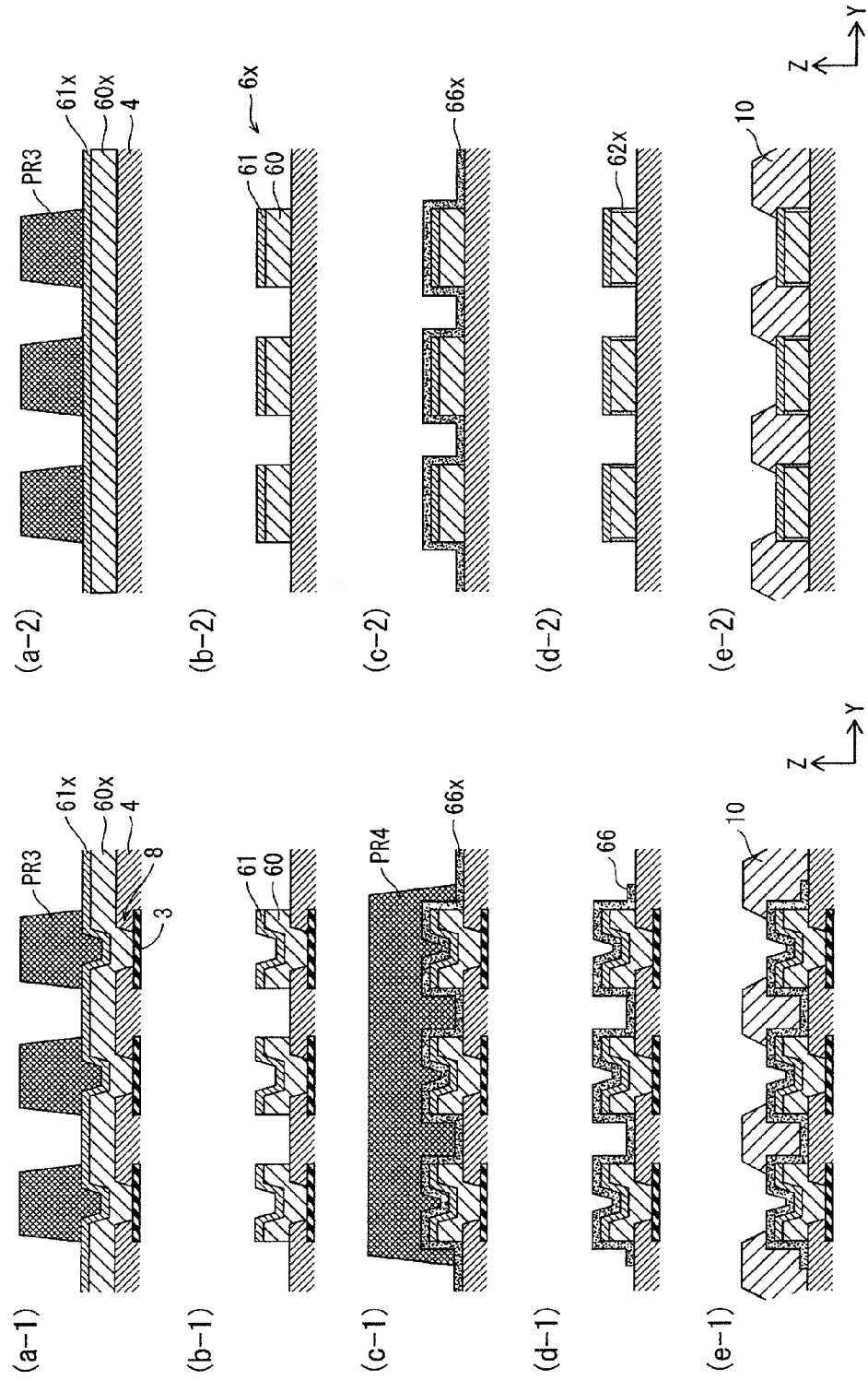
FIG. 9 shows conventional processes of manufacturing elements around the lower electrode (anode) of the present invention.
Figure 10:
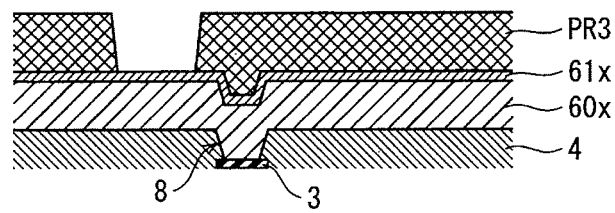
FIG. 10 shows conventional processes of manufacturing elements around the lower electrode (anode) of the present invention.
Figure 10:
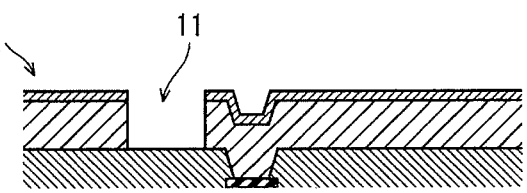
Figure 10:
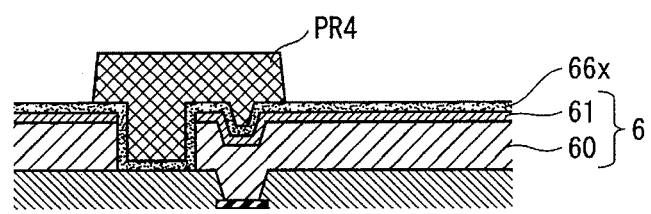
Figure 10:
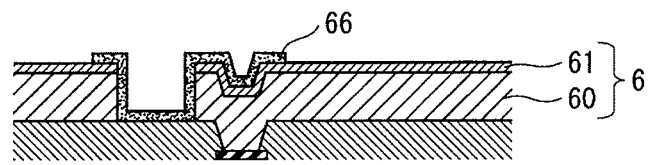
Figure 10:
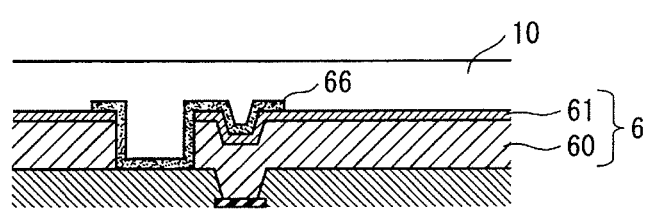
Figure 10:
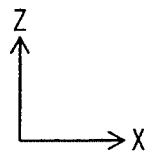

The following describes specific observations of the effects of the manufacturing method of the present invention, taking conventional lower electrode forming processes as a comparative example. (a-1) to (e-1) and (a-2) to (e-2) of FIG. 9 and (a-3) to (e-3) of FIG. 10 show the conventional lower electrode forming processes in order. (a-1) to (e-1) and (a-2) to (e-2) of FIG. 9 and (a-3) to (e-3) of FIG. 10 correspond to (a-1) to (f-1) and (a-2) to (f-2) of FIG. 5 and (a-3) to (f-3) of FIG. 6 of the present invention, respectively.

Conventionally, after the reflective metal layer 60X and the transparent conductive layer 61X are formed on the planarizing film 4 in this order, the third resist PR3 is formed in the lower electrode forming area based on the photolithographic method. Subsequently, the wet etching process and the wet ashing process are executed so as to execute patterning of the lower electrodes ((a-1) to (b-1) and (a-2) to (b-2) of FIG. 9 and (a-3) to (b-3) of FIG. 10). This is how the lower electrode 6X is formed. The insulating film 66X is uniformly formed on the substrate using SiON in the spattering method or the CVD method. Subsequently, portions of the insulating layer 66X corresponding to the lower electrodes are covered with the fourth resists PR4 based on the photolithographic method ((c-1) and (c-2) of FIG. 9 and (c-3) of FIG. 10). Subsequently, the pixel definition layer 66 is formed by patterning of the insulating film 66X in the dry etching process. Subsequently, the fourth resists PR4 are removed in the wet ashing process, and the substrate is cleansed. Subsequently, the banks 10 are formed based on the photolithographic method ((d-1) to (e-1) and (d-2) to (e-2) of FIG. 9 and (d-3) to (e-3) of FIG. 10). Note that when the fourth resists PR4 are removed in the wet ashing process, a thin metal oxide film 62X having a thickness of approximately 5 nm to 6 nm is formed on each lateral surface of the lower electrode 6X. However, the metal oxide films 62X cannot prevent the short due to the current that has passed through the transparent conductive film 61. Therefore, the metal oxide films 62X are clearly different from the metal oxide films 62 and 63 of the present invention.

As described in the above, the following processes are necessary in the conventional manufacturing method in order to form the lower electrodes 6X and pixel definition layers 66. The processes are: a separate photolithographic process for forming each of the resists PR3 and PR4, a process of generating the insulating film 66X (deposition), an etching process, an ashing process and a cleansing process, for example. This makes the manufacturing method complicated, and raises a problem that an amount of waste solution resulting from the etching increases. In order to solve this problem, according to the present invention, the resists PR1 and PR2 can be formed in one process and, the metal oxide films 62 and 63 can be formed in the ashing process for forming the lower electrode 6, as described in the above. Thus, the amount of waste solution for the etching is small due to the fact that the number of processes is comparatively small, in the present invention. Therefore, the present invention provides an extremely excellent possibility.

Note that a hole injection layer may be formed in the reactive spattering method before the subsequent third process. Specifically, a material such as molybdenum or tungsten may be used as a spattering source (target) to fill argon gas and oxygen gas as spattering gas and reactive gas respectively in the chamber. Thus, the hole injection layer is formed using oxide such as molybdenum or tungsten.

[Third Process: Bank Forming Process]

As shown in FIG. 2, (f-1) and (f-2) of FIG. 5 and (f-3) of FIG. 6, a plurality of strip-shaped banks 10 are formed in parallel on the substrate at a predetermined pitch. At this time, the pitch at which the banks are arranged is adjusted such that the lateral surfaces of each of the first electrodes in the column (Y) direction are covered by the adjacent banks 10.

Specific examples of materials for forming the banks in the bank forming process are a photosensitive resist material and a resist material containing the fluorinated material or acrylic material. The bank material is applied uniformly on the lower electrode 6 and the photosensitive resist is coated on the lower electrode 6 on which the bank material has been applied, based on the photosensitive resist method. A mask having a pattern of the banks 10 to be formed is layered on the lower electrode 6 on which the photosensitive resist has been coated. Subsequently, the resultant lower electrode 6 is exposed via the mask to form a resist pattern. Subsequently, an excessive bank material and uncured photosensitive resists are washed off with use of aqueous or non-aqueous etching solution (repellent). This completes the patterning of the bank material. Subsequently, the photosensitive resist (resist residue) on the patterned bank material is washed off (removed) with pure water. This completes formation of the banks 10. At least a surface of each of the banks 10 is water-repellant.

Note that in the process of forming the banks 10, the following steps may be further taken. Contact angles of the banks 10 with ink containing the organic light-emitting material are adjusted, the surfaces of the banks may be processed with use of predetermined alkaline solution, water or organic solution, for example, or plasma-treated in order for at least the surfaces of the banks to be water-repellant.

[Fourth Process: Light-Emitting Layer Forming Process]

Next, an organic material which is an organic light-emitting material and solvent are mixed at a predetermined ratio to adjust ink. This ink is supplied to an inkjet head of a known inkjet device system, and is applied on opposing surfaces of the adjacent banks 10 based on the wet process in the inkjet method. In the present invention, no pixel definition layer is provided. Therefore, the applied ink may move through the element forming areas (mutual flow). Therefore, the applied ink can flow before being dried so as to be even in thickness. A solvent property of the ink contributes to formation of the light-emitting layer having an even thickness in the light-emitting areas (FIG. 3).

[Fifth Process: Upper Electrode Forming Process]

Next, a film is formed on the surface of the light-emitting layer 7 using a material such as ITO or IZO in the vacuum evaporating method. This is how the upper electrode 9 is formed (FIG. 3).

Note that a sealing layer is formed on the surface of the upper electrode 9 using a material such as SiN (Silicon Nitride) or SiON (Silicon Oxide Nitride) in the vacuum evaporating method.

This is how the organic EL display panel of the present invention is manufactured.

<Other Matters>

The ashing process used in the manufacturing method of the present invention may be any known method (i.e. a plasma ashing method, a barrel ashing method, a single-wafer ashing method, a down-flow ashing method, a photoexcited ashing method and an ozone ashing method). However, it should be note that it is necessary to prepare an oxygen atmosphere in which aluminum or aluminum alloy used for forming the reflective metal films 60 can be oxidized, in the ashing process.

Also, the dry etching process is mainly used as an example of the etching process in the above-described processes of the present invention. However, the wet etching may be used.

INDUSTRIAL APPLICABILITY

Organic EL elements, an organic EL display panel and a manufacturing method of the present invention may be organic EL display elements used as display elements of displays of mobile phones or TV, or various types of light sources, an organic EL display panel using the same and a manufacturing method for the same.

What is claimed is:

1. An organic electroluminescence (EL) display panel, comprising:
 a substrate;
 a thin-film transistor layer formed on the substrate;
 an interlayer insulating film formed above the thin-film transistor layer;
 a plurality of strip-shaped barrier ribs arranged in parallel on the interlayer insulating film;
 a plurality of first electrode groups, each electrode group of the plurality of first electrode groups comprising first electrodes arranged in a line and between two adjacent barrier ribs of the plurality of strip-shaped barrier ribs, each electrode of the first electrodes including a transparent conductive film and a reflective metal film formed of a metal material;
 a plurality of light-emitting layers each formed to cover a different electrode of the plurality of first electrode groups; and
 a second electrode formed above the plurality of light-emitting layers, wherein each electrode of the first electrodes is formed such that:
 at least one of end portions of the first electrodes in a parallel direction with respect to the barrier ribs comprises a single-film portion in which the transparent conductive film is not formed; and
 a portion of the first electrode other than the single-film portion comprises a two-film portion in which the transparent conductive film is layered on the reflective metal film, and
 a metal oxide film is at least partially formed on an entire surface of the single-film portion of each electrode of the first electrodes by partially oxidizing the metal material of which the reflective metal film is formed.

2. The organic EL display panel of claim 1, wherein the metal oxide film is formed at least on each of an upper surface of the single-film portion of each of the first electrodes, and an outer end surface of the single-film portion in the parallel direction, the upper surface being uncovered by any of the strip-shaped barrier ribs.

3. The organic EL display panel of claim 1, wherein
 contact holes are provided in the interlayer insulating film through each of which a different one of the first electrodes is electrically connected with the thin-film transistor layer,
 each of the contact holes is covered with a covering portion of the single-film portion of a different one of the first electrodes, and
 the metal oxide film is formed on a surface of the covering portion of the single-film portion of each of the first electrodes.

4. The organic EL display panel of claim 1, wherein each of the light-emitting layers covering a different one of the first electrode groups comprises one color.

5. The organic EL display panel of claim 1, wherein a color of each of the plurality of light-emitting layers comprises one of a red color, a green color, and a blue color, and consecutive ones of the first electrodes along a direction orthogonal to the parallel direction are aligned.

6. The organic EL display panel of claim 1, wherein
 a thickness of a covering portion of each of the plurality of light-emitting layers that covers a different one of the first electrodes increases, in the parallel direction, from each end of the first electrode towards a center thereof to asymptotically approach a constant value, and
 a length of the single-film portion is as long as each of lengths from each of the ends towards the center to a point at which the thickness of the light-emitting layer reaches 90% of an average thickness of the light emitting layer in each of he first electrodes, in the parallel direction.

7. The organic EL display panel of claim 1, wherein a contact layer is provided between the interlayer insulating film and each of the first electrodes.

8. The organic EL display panel of claim 7, wherein the contact layer is formed using one of titanium, chrome and conductive oxide.

9. The organic EL display panel of claim 1, wherein the reflective metal film comprises one of aluminum and aluminum alloy, and the metal oxide film comprises aluminum oxide.

10. An organic EL display device having the organic EL display panel of claim 1.

* * * * *